United States Patent
Hormati

(10) Patent No.: US 10,911,212 B2
(45) Date of Patent: Feb. 2, 2021

(54) SKEW DETECTION AND CORRECTION FOR ORTHOGONAL DIFFERENTIAL VECTOR SIGNALING CODES

(71) Applicant: Kandou Labs SA, Lausanne (CH)

(72) Inventor: Ali Hormati, Ecublens Vaud (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/828,870

(22) Filed: Mar. 24, 2020

(65) Prior Publication Data

US 2020/0228302 A1 Jul. 16, 2020

Related U.S. Application Data

(63) Continuation of application No. 16/435,404, filed on Jun. 7, 2019, now Pat. No. 10,601,574.

(60) Provisional application No. 62/683,440, filed on Jun. 11, 2018.

(51) Int. Cl.
*H04L 7/02* (2006.01)
*H04L 7/00* (2006.01)

(52) U.S. Cl.
CPC .............. *H04L 7/02* (2013.01); *H04L 7/0087* (2013.01)

(58) Field of Classification Search
CPC ......... H04L 7/02; H04L 7/0276; H04L 7/033; H04L 7/0087; H04L 25/49; H04L 25/08; H04L 25/085; H04L 25/14; H04L 25/0292; H04L 25/0272; H04L 25/0274; H04B 3/06; H03M 7/20; H03M 5/14

See application file for complete search history.

(56) References Cited

U.S. PATENT DOCUMENTS

| | | |
|---|---|---|
| 5,334,956 A | 8/1994 | Leding et al. |
| 5,798,563 A | 8/1998 | Feilchenfeld et al. |
| 6,854,030 B2 | 2/2005 | Perino et al. |
| 7,085,336 B2 | 8/2006 | Lee et al. |
| 7,123,660 B2 | 10/2006 | Haq et al. |
| 7,145,411 B1 | 12/2006 | Blair et al. |
| 7,336,139 B2 | 2/2008 | Blair et al. |
| 7,366,942 B2 | 4/2008 | Lee |
| 8,782,578 B2 | 7/2014 | Tell |

(Continued)

OTHER PUBLICATIONS

International Search Report and Written Opinion for PCT/US2019/036169, dated Aug. 19, 2019, 1-12 (12 pages).

(Continued)

*Primary Examiner* — Siu M Lee
(74) *Attorney, Agent, or Firm* — Invention Mine LLC

(57) ABSTRACT

Methods and systems are described for receiving a plurality of signals corresponding to symbols of a codeword on a plurality of wires of a multi-wire bus, and responsively generating a plurality of sub-channel outputs using a plurality of multi-input comparators (MICs) connected to the plurality of wires of the multi-wire bus, generating a plurality of wire-specific skew control signals, each wire-specific skew control signal of the plurality of wire-specific skew control signals generated by combining (i) one or more sub-channel specific skew measurement signals associated with corresponding sub-channel outputs undergoing a transition and (ii) a corresponding wire-specific transition delta, and providing the plurality of wire-specific skew control signals to respective wire-skew control elements to adjust wire-specific skew.

20 Claims, 8 Drawing Sheets

(56) References Cited

U.S. PATENT DOCUMENTS

| | | | |
|---|---|---|---|
| 9,300,503 B1 * | 3/2016 | Holden | H04L 25/028 |
| 9,319,218 B2 | 4/2016 | Pandey et al. | |
| 9,577,815 B1 * | 2/2017 | Simpson | H04L 7/0025 |
| 10,243,614 B1 * | 3/2019 | Ulrich | H04B 3/462 |
| 10,313,068 B1 | 6/2019 | Ahmed et al. | |
| 10,601,574 B2 * | 3/2020 | Hormati | H03M 5/14 |
| 2001/0055344 A1 | 12/2001 | Lee et al. | |
| 2003/0046618 A1 | 3/2003 | Collins | |
| 2005/0134380 A1 | 6/2005 | Nairn | |
| 2006/0092969 A1 | 5/2006 | Susnow et al. | |
| 2007/0103338 A1 | 5/2007 | Teo | |
| 2008/0175586 A1 | 7/2008 | Perkins et al. | |
| 2010/0153792 A1 | 6/2010 | Jang | |
| 2011/0156757 A1 | 6/2011 | Hayashi | |
| 2012/0020660 A1 | 1/2012 | Le et al. | |
| 2012/0050079 A1 | 3/2012 | Goldman et al. | |
| 2013/0091392 A1 | 4/2013 | Valliappan et al. | |
| 2013/0249719 A1 | 9/2013 | Ryan | |
| 2014/0112376 A1 | 4/2014 | Wang et al. | |
| 2016/0134267 A1 * | 5/2016 | Adachi | H03K 5/156 327/237 |
| 2016/0380787 A1 * | 12/2016 | Hormati | H04L 1/0041 375/233 |
| 2017/0317449 A1 | 11/2017 | Shokrollahi et al. | |
| 2017/0317855 A1 * | 11/2017 | Shokrollahi | H04L 25/4919 |

OTHER PUBLICATIONS

Wang, Yi-Ming, et al., "Range Unlimited Delay-Interleaving and -Recycling Clock Skew Compensation and Duty-Cycle Correction Circuit", IEEE Transactions on Very Large Scale Integration (VLSI) Systems, vol. 23, No. 5, May 2015, 856-868 (13 pages).

* cited by examiner

SKEW DETECTION AND CORRECTION FOR ORTHOGONAL DIFFERENTIAL VECTOR SIGNALING CODES

CROSS-REFERENCE TO RELATED APPLICATIONS

This application is a continuation of U.S. application Ser. No. 16/435,404, filed Jun. 7, 2019, naming Ali Hormati, entitled "Skew Detection and Correction for Orthogonal Differential Vector Signaling Codes", which claims the benefit of U.S. Provisional Application No. 62/683,440, filed Jun. 11, 2018, naming Ali Hormati, entitled "Skew Detection and Correction for Orthogonal Differential Vector Signaling Codes", all of which are hereby incorporated by reference in their entirety for all purposes.

REFERENCES

The following prior applications are herein incorporated by reference in their entirety for all purposes:

U.S. Pat. No. 9,288,089, filed May 20, 2010 as application Ser. No. 12/784,414 and issued Mar. 15, 2016, naming Harm Cronie and Amin Shokrollahi, entitled "Orthogonal Differential Vector Signaling", hereinafter identified as [Cronie].

U.S. Pat. No. 9,100,232, filed Feb. 2, 2105 as application Ser. No. 14/612,241 and issued Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Simpson].

U.S. patent application Ser. No. 15/582,545, filed Apr. 28, 2017, naming Ali Hormati and Richard Simpson, entitled "Clock Data Recovery Utilizing Decision Feedback Equalization", hereinafter identified as [Hormati].

U.S. patent application Ser. No. 15/641,313, filed Jul. 4, 2017, naming Roger Ulrich, Armin Tajalli, Ali Hormati, and Richard Simpson, entitled "Method for Measuring and Correcting Multi-wire Skew", hereinafter identified as [Ulrich].

BACKGROUND

The need for increased communications bandwidth has led to progressive increase in communications speeds, with single wire serial channel rates now measured in tens of gigabits per second. Ideally, a multiwire communications channel could deliver even more bandwidth by sending entire "words" of data in parallel across multiple channel elements, but such schemes are inevitably constrained by the differential propagation delays of the various channel elements. As the variations in arrival time for the various data elements becomes a significant percentage of the transmission unit interval for the channel, the time window during which an entire valid data word may be captured shrinks, and eventually closes.

In an ideal world, a multiwire communications receiver would incorporate detailed amplitude and timing detection apparatus on each individual wire input, allowing every variation in signal strength or timing to be measured, analyzed, and mitigated. Unfortunately, real-world systems operate under constraints on power, complexity, and speed, thwarting introduction of any but the most essential detection components. In practice, a multiwire receiver may be limited to a sampler capturing receive data from each wire, wire pair, or wire group comprising a data channel, and some minimal means to maintain receive clock synchronization. Thus, the effects of differential propagation time or "skew" among the input signals will be experienced as reduced signal quality, in particular as horizontal reduction of the eye opening in a time-versus-amplitude received signal "eye" diagram, with no additional information as to how the problem might be mitigated.

As one example, consider a two wire differential circuit terminating in a single differential line receiver. If one of the two wires has a significantly different propagation time than the other, the time interval within which the differential line receiver output is valid will be reduced, but there is no way of knowing which of the two input signal paths is the problem. Various solutions have been proposed in the art, generally incorporating adjustable delay elements in the received wire signal paths, combined with trial-and-error delay adjustments seeking to "tune" those signal paths for maximum signal quality.

The situation is somewhat better for receivers that derive receive clock information from received signal transitions. As transitions may occur on any received signal channel, each channel will typically incorporate some minimal clock-data-alignment or CDR apparatus, typically comprised of an additional sampler configured to provide "early/late" feedback for the local sampling clock source, relative to input signal transitions. However, as shown by the differential receiver example above, one timing datum per receive channel may not be sufficient to unambiguously resolve the source of timing errors to the individual wire path level.

BRIEF DESCRIPTION

In a multiwire communications channel, differential delay characteristics among the signal wires (skew) may lead to degraded received signal quality. A method and apparatus are described in which timing information derived from detected data signals may be correlated with particular wire input delays, facilitating skew correction.

Methods and systems are described for receiving a plurality of signals corresponding to symbols of a codeword on a plurality of wires of a multi-wire bus, and responsively generating a plurality of sub-channel outputs using a plurality of multi-input comparators (MICs) connected to the plurality of wires of the multi-wire bus, generating a plurality of wire-specific skew control signals, each wire-specific skew control signal of the plurality of wire-specific skew control signals generated by combining (i) one or more sub-channel specific skew measurement signals associated with corresponding sub-channel outputs undergoing a transition and (ii) a corresponding wire-specific transition delta, and providing the plurality of wire-specific skew control signals to respective wire-skew control elements to adjust wire-specific skew.

DETAILED DESCRIPTION

Figure 1:
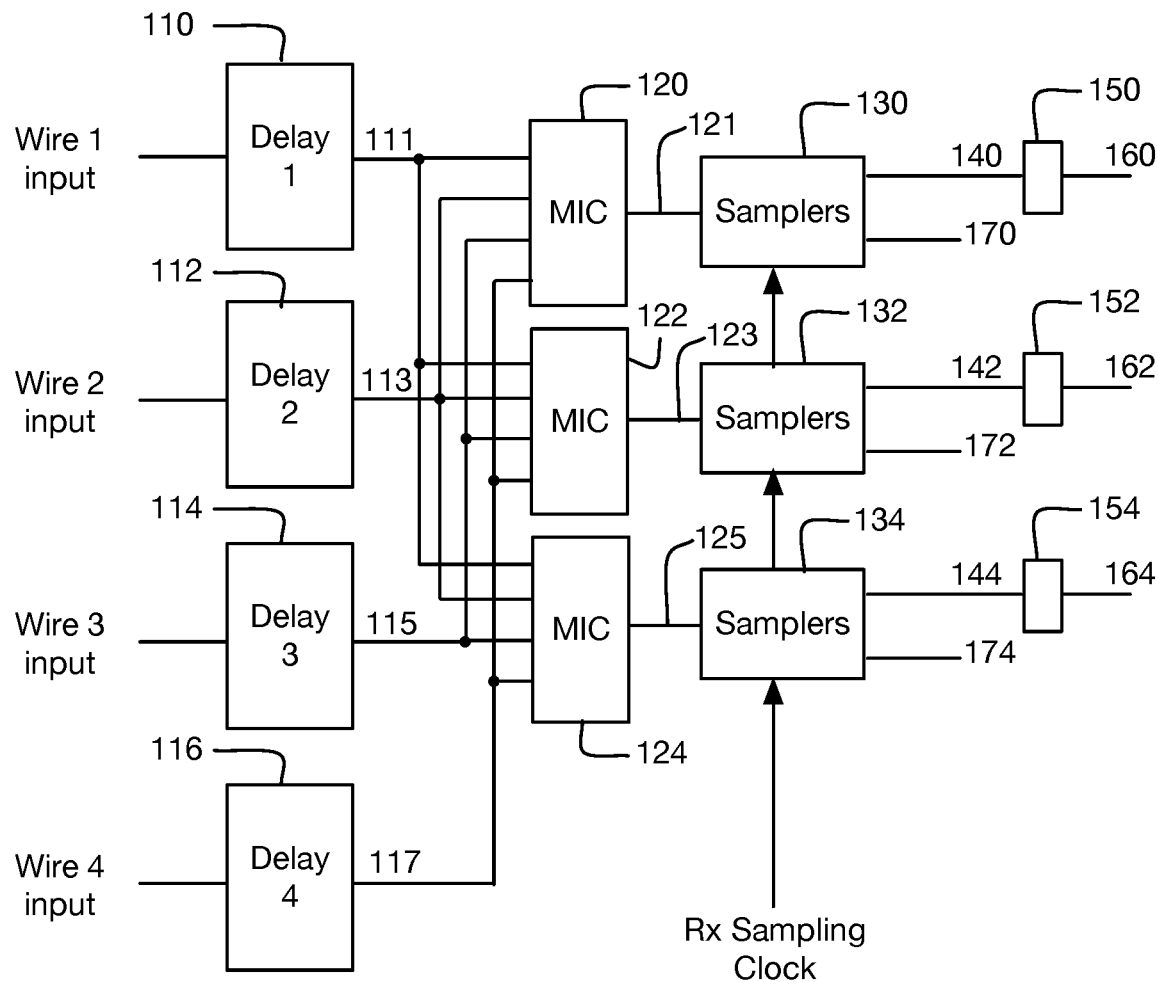
FIG. 1 is a block diagram of a receiver embodiment in accordance with some embodiments.

Orthogonal Differential Vector Signaling codes (ODVS) are described [Cronie] as being particularly suited to use in high-speed multiwire communication systems. In one common interpretation, ODVS has been treated as a word-oriented encoding/decoding method providing improved performance and robustness; data words are encoded into ODVS codewords for transmission essentially in parallel on multiple signal wires, one such codeword per unit interval, with the receiver subsequently detecting those codewords and decoding them recover the data. In this view, differential wire propagation time, also known as channel skew, may be seen as disrupting the detection of complete and valid codewords, thus introducing an upper bound on communication speed.

In an alternative view, each ODVS codeword may be interpreted as a summation of multiple independent (e.g. orthogonal) sub-channel signals, each modulated by one data element of the overall data word being transmitted. Depending on the particular ODVS code being used, each sub-channel may be influenced by different wire groups of the overall multiwire channel, and thus have distinct (and thus, independently measurable and treatable) skew characteristics.

An ODVS code is described and defined by a matrix. Each row of the matrix may be interpreted as a vector of weighted signal elements comprising one sub-channel, with each column represents one wire of the multiwire communications channel. An individual wire signal may thus contribute to multiple sub-channel results in various combinations with other wire signals.

Without implying limitation, the H4 code of [Cronie], also known as the Enhanced Non-Return-to-Zero or ENRZ code, will be used in the subsequent examples. ENRZ encodes three data bits for transmission over a four wire channel. Its defining matrix is:

$$H_4 = \begin{bmatrix} +1 & +1 & +1 & +1 \\ +1 & -1 & +1 & -1 \\ +1 & +1 & -1 & -1 \\ +1 & -1 & -1 & +1 \end{bmatrix} \quad \text{(Eqn. 1)}$$

and encoding of the three bits $D_0$, $D_1$, $D_2$ may be obtained by multiplying those bits times the Hadamard matrix $H_4$ to obtain four output values.

In the word-oriented view, the three bit data word D<2:0> is multiplied by this matrix to encode the data into a four value codeword representing the output values [A, B, C, D].

In the alternative sub-channel view, the uppermost vector of the matrix is described as corresponding to common mode signaling, which is not used herein. Each of the next three vectors are multiplied by one of the data bits $D_0$, $D_1$, $D_2$ to produce three modulated sub-channels, which are then summed together to produce output values A, B, C, D.

The Glasswing code of [Shokrollahi] will also be referenced subsequently as another example of an ODVS code. Glasswing encodes five data bits for transmission over a six wire channel, and is described by the matrix:

$$\begin{bmatrix} 1 & 1 & 1 & 1 & 1 & 1 \\ 1 & 0 & -1 & 0 & 0 & 0 \\ 1/2 & -1 & 1/2 & 0 & 0 & 0 \\ 0 & 0 & 0 & 1 & 0 & -1 \\ 0 & 0 & 0 & 1/2 & -1 & 1/2 \\ 1/3 & 1/3 & 1/3 & -1/3 & -1/3 & -1/3 \end{bmatrix} \quad \text{(Eqn. 2)}$$

As taught by [Cronie], ODVS may be decoded by multiplication of the received signals by the inverse of the encoding matrix. [Shokrollahi] further teaches that one efficient means of performing this operation uses Multi-Input Comparators (MICs). Each MIC computes a linear summation of weighted input elements derived from the vector of weights for that sub-channel in the inverse or detection matrix. Thus, a set of MICs that detect the ENRZ sub-channels may be described by the equations:

$$R_0 = (A+C) - (B+D) \quad \text{(Eqn. 3)}$$

$$R_1 = (C+D) - (A+B) \quad \text{(Eqn. 4)}$$

$$R_2 = (C+B) - (D+A) \quad \text{(Eqn. 5)}$$

Figure 7:
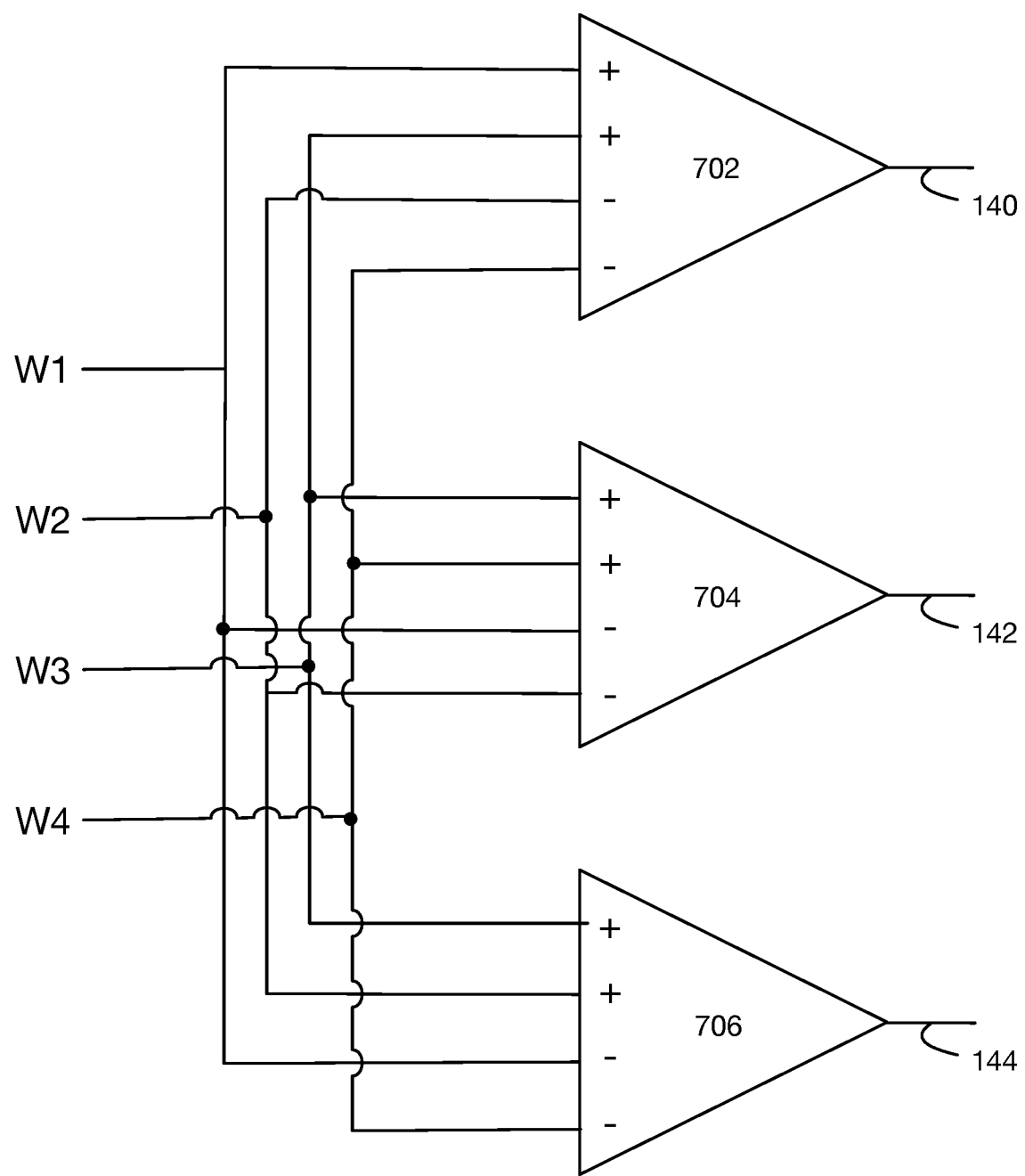
FIG. 7 is a block diagram of a multi-input comparator (MIC) network in accordance with some embodiments.

In one embodiment, these equations may be efficiently implemented in analog logic as three instances of a four-input differential amplifier, each amplifier having two inverting and two non-inverting inputs all of equal weight. As is apparent by examining Eqns. 3, 4, and 5, each of the wire input signals A, B, C, D contributes to each detected sub-channel result $R_0$, $R_1$, $R_2$, in a unique and orthogonal combination. FIG. 7 illustrates a network of MICs 702/704/706 for implementing Eqns. 3, 4, and 5 above, respectively. In FIG. 7, wire W1 corresponds to 'A', wire W2 corresponds to 'B', wire W3 corresponds to 'C' and wire W4 corresponds to 'D'.

Example Embodiment

Figure 8:
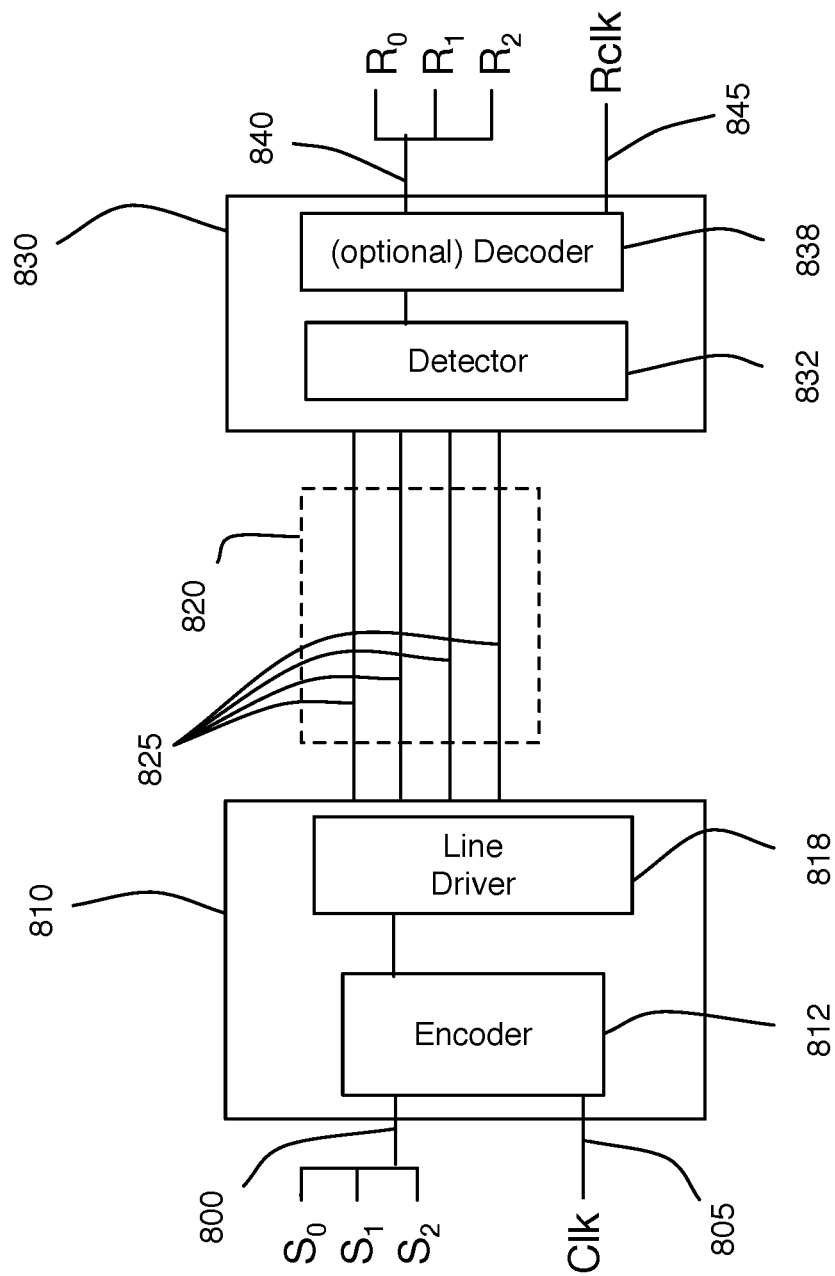
FIG. 8 shows a system with a transmitter 810 communicating over channel 820 comprising a multi-wire bus having multiple wires 825 to receiver 830.

FIG. 8 illustrates an exemplary system, in accordance with some embodiments. As shown, FIG. 8 includes a transmitter 810 that receives source data $S_0$-$S_2$ 800 and Clk 805, and an encoder 812 that encodes the information for transmission over a channel 820 including a multi-wire bus having multiple wires 825 via line driver 818. FIG. 8 further includes a receiver 830 including a detector 832 and in some embodiments includes a decoder 838, if needed, for producing receive data $R_0$-$R_2$ 140 and a receive clock Rclk 845.

For purposes of description and without implying limitation, the embodiment of FIG. 1 illustrating an ENRZ data receiver will be used as an example. The four received input signals, herein identified as Wire 1, Wire 2, Wire 3, Wire 4, may have additionally been amplified, undergone frequency-dependent equalization, etc. as known in the art. As one example of skew mitigation in accordance with the subsequent descriptions, individual adjustable or configurable signal delay elements 110, 112, 114, 116 have been inserted into the wire signal paths, resulting in delayed wire signals 111, 113, 115, 117 which are then input to three Multi-Input Comparators 120, 122, 124. As previously described, these MICs detect the three ENRZ sub-channel signals, 121, 123, 125, which are then sampled 130, 132, 134 using a Rx Sampling Clock to produce received sub-channel outputs 140, 142, 144.

As will subsequently be described in further detail, the samplers additionally provide a second sampled value providing an indication of the relative timing relationship between signal transitions of the sub-channel signals and the Rx Sampling Clock. These second sampled values, 170, 172, 174 respectively, will subsequently be referred to as the CDR sampled values.

The subsequent descriptions also utilize a history of sub-channel outputs received consecutive preceding unit intervals. As a descriptive convenience, FIG. 1 illustrates the sub-channel outputs 140, 142, 144 detected in the current unit interval as being captured by clocked latches 150, 152, 154 to be retained as the comparable sub-channel outputs from the previous unit interval 160, 162, 164. No limitation is implied, with other receiver architectures and embodiments known to provide such data histories either directly, or by other storage means such as a data history buffer, or D flip flops being clocked by a sampling clock.

Figure 3:
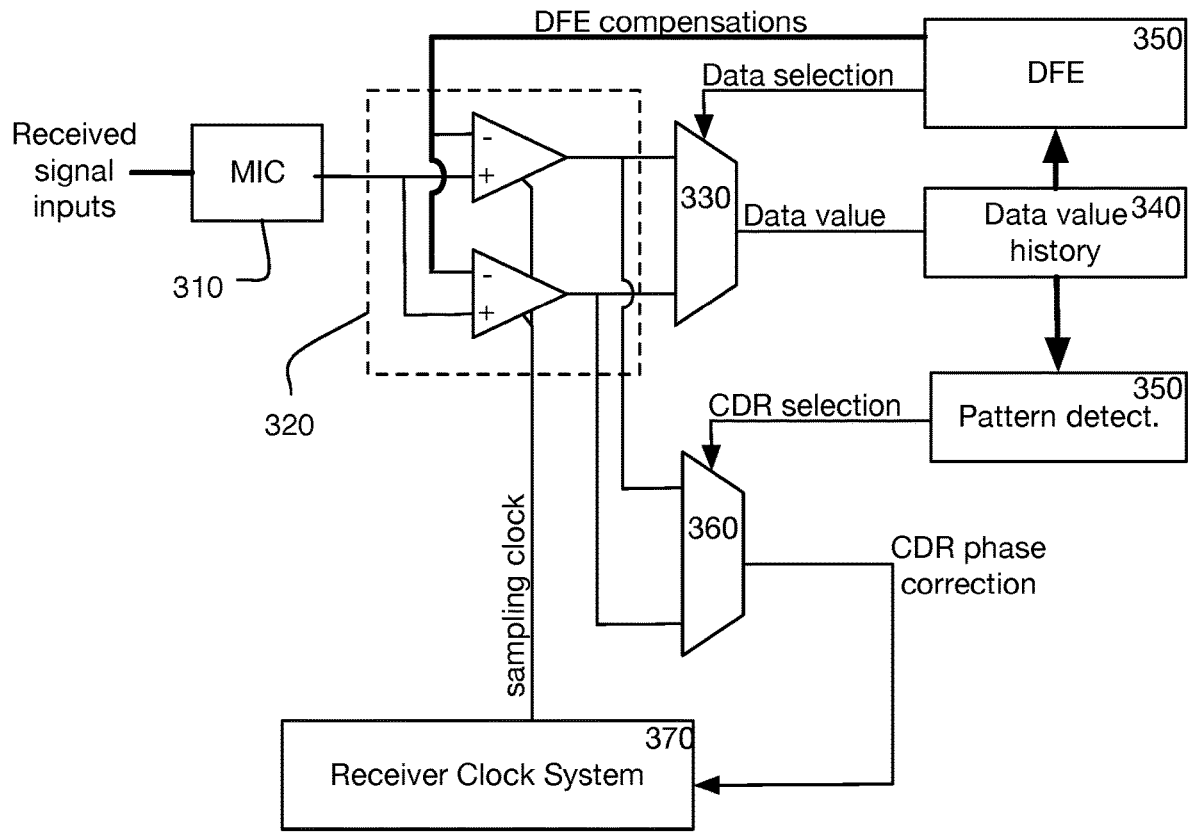
FIG. 3 is a block diagram showing one embodiment of a receiver obtaining a data sample and a timing sample from a received signal.

A more detailed example of one sampler embodiment similar to that of [Hormati] is illustrated in FIG. 3. It includes at least one stage of speculative DFE 350 supported by two data samplers 320 performing concurrent time-sampling operations at two different amplitude thresholds, and a receiver clock system 370 to produce a sampling clock, the phase of which may be adjusted by a CDR sampled value to optimize data sampling timing.

As is well understood in the art, the two different amplitude thresholds used by the speculative sampling stage correspond to the desired data slicing threshold under the assumptions that the previous sub-channel output was a '1', or that it was a '0'. When the actual sub-channel output for the previous interval is resolved, the appropriate sampled result is accepted as the detected sub-channel output, and the other sampled result is typically discarded. As described by [Hormati], under some conditions that other sampled result may be utilized as an indication whether the data sampling clock is early or late, essential information in producing the CDR correction needed to maintain data sampling timing. Where a common sampling clock is used for all received data samplers, that CDR correction is a summation or consensus based on the CDR sampled values from all data channels.

Numerous other embodiments providing such CDR information are known in the art and equally applicable. As another example, each sub-channel may incorporate a second sampler controlled by a sampling clock occurring at the beginning of each unit interval, rather than in the middle of the unit interval as is a conventional data sampler. In such a so-called "double baud rate" configuration, this second sampler is ideally configured to capture signal transitions at the beginning of each receive unit interval, and thus provide an indication as to whether the sampling clock is concurrent with received data transitions.

Early/Late Detection

Although the result obtained from the CDR sampler is often colloquially called an "early/late" indication [Simpson], it actually represents a "last data/present data" result. That is, if the sampling clock is "early" relative to the actual signal transition, the sample result will be identical to the data of the previous unit interval, because the signal being sampled has not yet changed to its new value. Conversely, if the sampling clock is "late" relative to the actual signal transition, the sample result will be identical to the data of the present unit interval, because the signal being sampled has already changed. Thus, several steps are needed before the raw sampled value may accurately be called an "Early or Late" signal.

First, each CDR sampler result may be qualified, to confirm it actually is associated with a transition event or some transitional pattern. In some embodiments, this may simply require that it be ANDed with or otherwise be gated by a Boolean signal that is 'true' if the sampled sub-channel has undergone a transition. In one embodiment, a sub-channel transition is identified by XORing the previous and current received sub-channel outputs. In some embodiments, alternative transitional data patterns may be determined, such as triplet patterns "100" or "011" (or other patterns deemed suitable for reliable early/late determinations such as perhaps "110" or "001" or shorter patterns "01" and "10", or longer patterns such as "1100" or "0011"), where each triplet pattern corresponds to sub-channel output data decisions in the "previous, current, next" signaling intervals. Detection of such triplet patterns may be performed using e.g., a logic three-input AND gate. The identified triplet pattern and the CDR sample may then be used to determine if the sampling instant used to generate the CDR sample is early or late, as described below.

Once qualified, the sampled result may be correlated with the sub-channel output, to determine whether it represents early or late timing. If the sub-channel output transitioned from '0' to '1', sampling early (i.e. before the signal transitions) will record a '0', while sampling late will record a '1'. The opposite situation applies for a 1→0 transition. Thus, an "Early" sampling clock corresponds to a different qualified sampled result from the current data value, while a "Late" sampling clock corresponds to the same result.

As described in [Hormati], other embodiments may impose additional constraints on the validity of a transition timing measurement, such as requiring three consecutive sub-channel outputs to match a particular pattern for the sampled result to represent a valid timing indicator. In such embodiments, delay involved in such pattern matching may require the described skew detection computations to be performed using a stored copy of the sampled result corresponding to the detected transition event, and stored copies of the sub-channel output detected immediately preceding and immediately following that transition.

To avoid descriptive confusion, whether real-time information or stored copies, the inputs to the subsequent descriptions the sample taken from detected sub-channel s to assess its transition timing relative to the sampling clock will be called CDR(s); the sub-channel output detected on sub-channel s at time t (i.e. immediately following the transition) will be called data(s,t); and the sub-channel output detected on sub-channel s at time t−1 (i.e. immediately preceding the transition) will be called data(s, t−1). The corresponding combined sub-channel outputs D<0:2> detected across all sub-channels at times t and t−1 will be called D(t) and D(t−1). Similarly, for descriptive purposes the qualifying characteristic validating the usefulness of a CDR(s) sample will be assumed to be a signal transition on sub-channel s, detectable as one example by an XOR between data(s, t) and data(s, t−1).

Skew Detection

As described earlier, the detected data signal on an ODVS sub-channel is generally derived from multiple wire signals, thus it follows that an aggregate timing offset of the sub-channel result is similarly derived from skewed arrival times of one or more of its component wire signals. The amount and polarity of each wire's effect on the sub-channel is a function of each wire signal's signed weight in producing the sub-channel result. Using ENRZ sub-channel 1 as an example, Eqn. 4 suggests that a detected 0→1 transition of result $R_1$ may occur either because wire C and/or wire D transitioned 0 →1 (as those wires make a positive contribution to the result) and/or that wire A and/or wire B transitioned 1 →0 (as those wires provide a negated contribution to the result.)

Unlike the previous CDR computation, a single sampler measurement cannot be correlated with a single data result in determining wire skew in an ODVS system, as a given wire may contribute to multiple sub-channels, and each sub-channel result may reflect the contribution of multiple wires. Instead, a simple "voting" scheme is used to track these contributions over time, allowing results from multiple sub-channels and multiple wire transitions to be aggregated into consensus results. If, as an example, Wire A and Wire B both receive multiple "Late" votes from Sub-channel 1 over time, but over a comparable period Sub-channel 2 has also given a comparable number of "Early" votes to Wire A and "Late" votes to Wire B, then in the aggregate it appears likely that the clock transition is occurring later than the signal transitions on Wire B (as for that wire the total of all votes are in that direction, whereas votes are evenly split for the other wire) suggesting that additional delay should be added to the Wire B signal before it is used by the MICs.

As the complete ODVS "code book" mapping all possible combinations of sub-channel outputs to all possible wire signal combinations exists, (and indeed is likely to have been utilized in the transmission embodiment) the corresponding wire states for the current and the previous sets of sub-channel outputs may be looked up and compared, to identify the magnitude and direction of each wire transition between those unit intervals. This allows a "vote" to be proportional not only to the relative weight which its wire imposes on a given sub-channel, but also to the actual amplitude of the transition that is suspected to be mistimed, as it has been observed that a large wire transition will have less impact than a small wire transition on the perceived timing offset of a sub-channel signal derived from that wire.

It should be noted that multiplying a wire transition by its MIC weight also allows the resulting product to be compared directly to a CDR sampled value, as in the previous example of Early/Late determination. One embodiment does so by mapping '0' or '1' CDR sampled values to {−1, +1} for computational convenience and then, for each sub-channel having a qualified result and for each wire contributing to that sub-channel, multiplying the mapped CDR value by the MIC weight for that wire and that sub-channel, and by the amount of the wire transition. The resulting wire "vote" is added to the running vote total for all such votes over time.

Unlike the skew measurement procedure described by [Ulrich], no measurements of received "eye" amplitude or width are required by the present embodiments, which also provides a direct and easily calculated correlation between detected timing variations in sub-channel signals and causative arrival time variations in wire signals.

Figure 2:
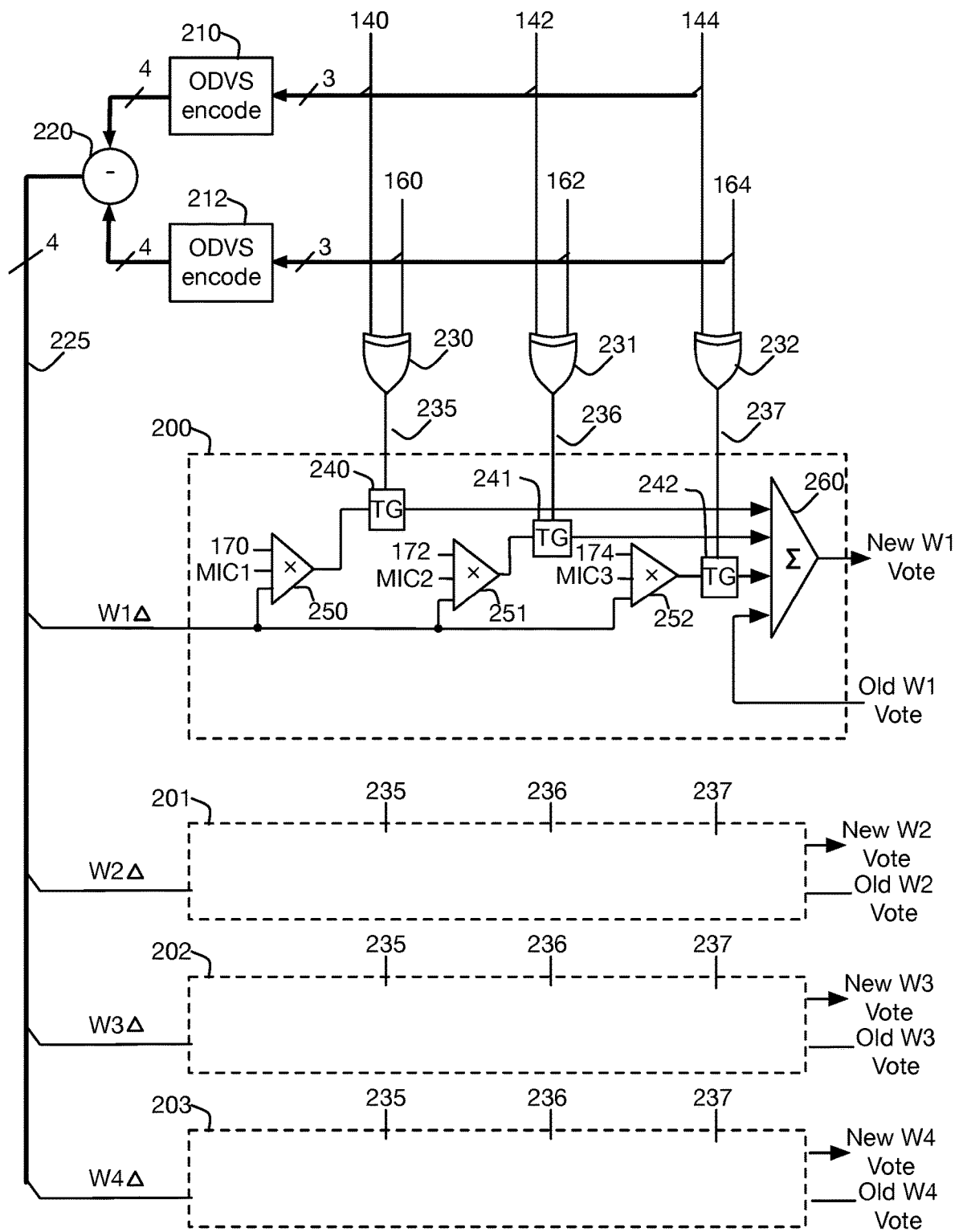
FIG. 2 is a circuit diagram for an apparatus in accordance with some embodiments.

FIG. 2 illustrates an embodiment performing the skew detection procedure in hardware, using signals detected sub-channel outputs obtained from the MICS 120, 122, and 124 in the receiver of FIG. 1. Signals Sub-channel outputs 140, 142, 144 are the current or most recently detected sub-channel outputs on Sub-channels 1, 2, and 3, respectively, and 160, 162, 164 are the same signals previously-detected sub-channel outputs latched from the previous unit interval. Thus, as earlier described, an XOR operation 230, 231, 232 between the current and previous values sub-channel outputs identifies 235, 236, 237 sub-channels having transitioned undergoing a transition between those unit intervals, i.e. ones for which the corresponding CDR sampled value is qualified.

In some embodiments, a skew control circuit 200 includes a plurality of MICs 120/122/124 configured to receive a plurality of signals 111/113/115/117 corresponding to symbols of a codeword on a plurality of wires of a multi-wire bus. The plurality of MICs are configured to generate linear combinations of the received signals, which may be subsequently sampled to generate the plurality of sub-channel outputs 140/142/144. In some embodiments, the sampling operation of samplers 130/132/134 may be implemented as part of MICs 120/122/124, respectively.

The skew control circuit of FIG. 2 may include a plurality of wire-specific skew control circuits 200/201/202/203, each being configured to generate a respective wire-specific skew control signal of a plurality of wire-specific skew control signals. As shown in FIG. 2, each wire-specific skew control signal of the plurality of wire-specific skew control signals may be generated by a corresponding wire-specific skew control circuit, e.g., 200, by combining (i) one or more sub-channel specific skew measurement signals associated with corresponding sub-channel outputs undergoing a transition and (ii) a corresponding wire-specific transition delta. In FIG. 2, each multiplier 250/251/252 generates one of the one or more sub-channel specific skew measurement signals, and transition gates 240/241/242 identify which sub-channel specific skew measurement signals are associated with sub-channels undergoing transitions. In FIG. 2, logical XOR gates 230/231/232 compare sub-channel outputs detected in the current unit interval 140/142/144 to respective previously-detected sub-channel outputs 160/162/164 that were detected in a previous unit interval to identify which sub-channel outputs have undergone a transition. Identifying the sub-channels undergoing transitions allows the wires-specific skew control signals to only utilize sub-channel specific skew measurement signals that were obtained on a signal transition, as information obtained on a signal transition may be used in determining clock timing characteristics.

As shown in FIG. 2, each sub-channel specific skew measurement signal may include a corresponding early-late indication component 170/172/174 obtained based on the corresponding sub-channel output. In some embodiments, the corresponding early-late indication component corresponds to an output of a sampler performing speculative decision feedback equalization (DFE). One particular sampler is shown in FIG. 3. In such an embodiment, the sampler may apply a pair of speculative DFE compensation values generated by DFE circuit 350 to a detected sub-channel output provided by MIC 310, and a data value history element 340 may be used to provide a selection signal to multiplexer 330 for selecting one of the corrected samples as a data decision, and the other corrected sample may be selected using multiplexer 360 as the early-late indication component e.g., 170/172/174 in the event a transition has occurred in the detected sub-channel output using transition gates 240/241/242. In FIG. 3, the transition gate functionality may be incorporated as part of pattern detect circuit 350.

In some embodiments, each sub-channel specific skew measurement signal includes a corresponding MIC input weighting coefficient component associated with a MIC generating the corresponding sub-channel output undergoing a transition. In FIG. 2, the MIC input weighting coefficients are denoted MIC1 provided to multiplier 250, MIC2 provided to multiplier 251, and MIC3 provided to multiplier 252. Each MIC coefficient component may have both a sign and a magnitude. Analyzing Eqns. 3-5, and the MIC network of FIG. 7, it may be observed that for wire W1 ('A'), the MIC input weighting coefficients provided to the multipliers may correspond to MIC1='1', MIC2=-1', and MIC3='-1'. Similarly, for wire-specific skew control circuit 201 operating on wire W2 ('B'), MIC1='-1', MIC2='-1', MIC3='1'. Similar observations may be made for wires W3 and W4. It should also be noted that the magnitudes need not be limited to '1'. For example, the Glasswing matrix of Eqn. 2 demonstrates that MIC input weighting coefficient components may take on various magnitudes e.g., ½ and ⅓, and may thus be provided as multi-bit inputs to digital multipliers 250/251/252.

As shown in FIG. 2, the corresponding wire-specific transition delta W1Δ is applied to each sub-channel specific skew measurement via the corresponding multiplier. It should be noted that in some embodiments, the wire-specific transition delta W1Δ may be applied to an aggregation of the one or more sub-channel specific skew measurement signals, i.e., the wire-specific transition delta W1Δ may be applied via a multiplier after combining circuit 260 or alternatively applied at a single stage within combining circuit 260. In some embodiments, the corresponding wire-specific transition delta includes both a transition magnitude and transition direction (e.g., a sign applied to the magnitude). In some embodiments, a given wire-specific transition delta is generated by generating a plurality of signals corresponding to recreated symbols of the received codeword and recreated symbols of a previously-received codeword, and responsively forming a difference 220 between a signal corresponding to a recreated symbol of the received codeword and a signal corresponding to a recreated symbol of the previously-received codeword. In such embodiments, the skew control circuit comprises local encoders 210 and 212 configured to generate the plurality of signals corresponding to recreated symbols of the received codeword and the previously-received codeword, the local encoders 210 and 212 configured to re-encode corresponding sets of sub-channel outputs 140/142/144 and 160/162/164, respectively.

Figure 5:
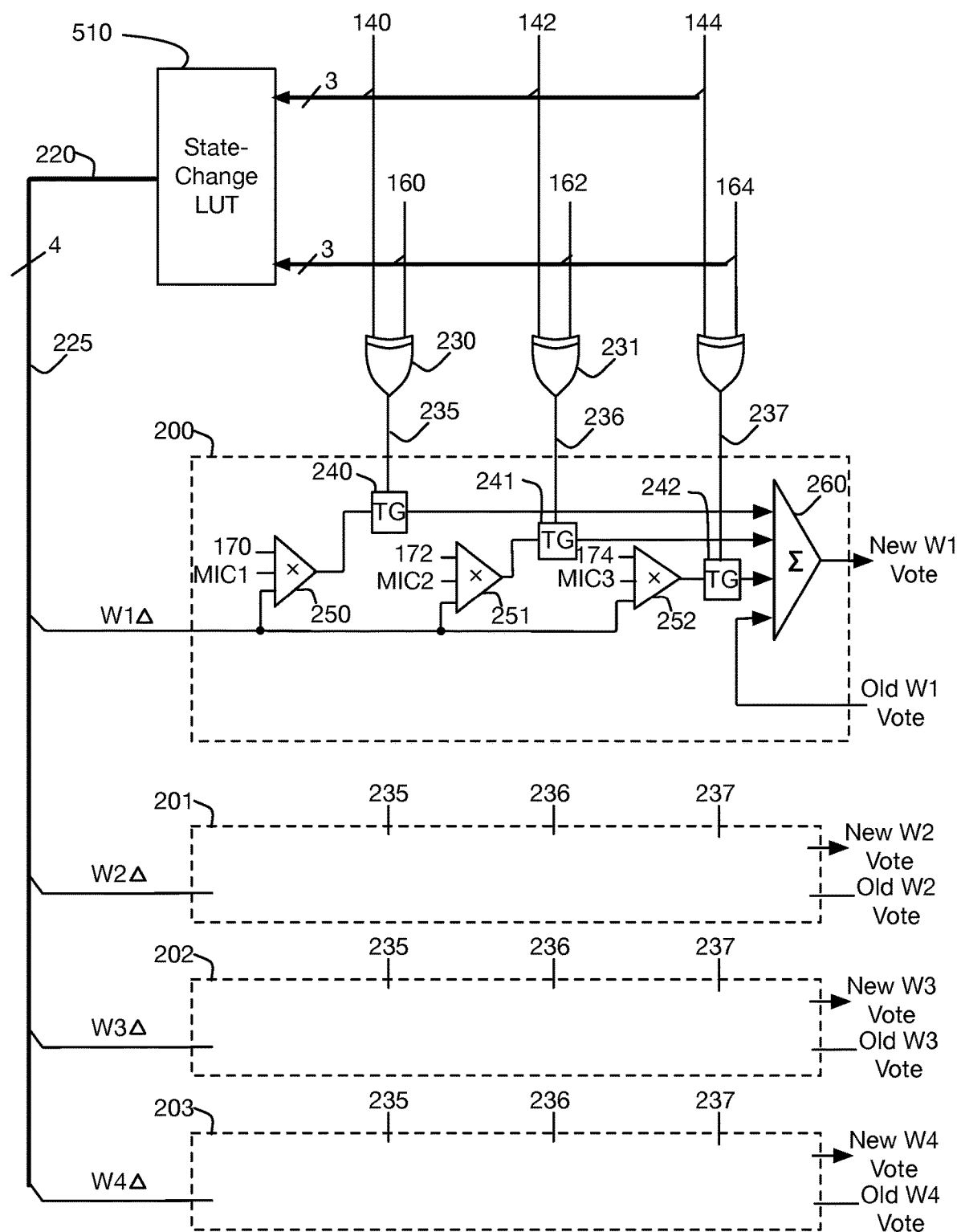
FIG. 5 is a block diagram of a skew control circuit utilizing a state-change lookup table, in accordance with some embodiments.

In some embodiments, the current and previous sub-channel data words are each processed by a local encoder (e.g., an ENRZ encoder) to obtain the equivalent wire signals for the corresponding unit intervals. In at least one embodiment, as shown in FIG. 5, the skew control circuit may include a state-change look-up table (LUT) 510, in which the eight possible input combinations are converted to four equivalent wire signal values (which for ENRZ may be represented, as one example, using a symbol alphabet of four possible two-bit values.) In another embodiment, the conversion may be to four analog signals that may each take on four possible values. Regardless of representation, 220 subtracts the two sets of wire values, to produce four wire-specific transition deltas 225, corresponding to the transition amplitude and direction of the four wires between the two unit intervals.

In some embodiments, the skew control circuit is configured to provide each wire-specific skew control signal of the plurality of wire-specific skew control signals to a corresponding wire-skew adjustment circuit connected to a corresponding wire of the plurality of wires of the multi-wire bus, delay elements 110/112/114/116 shown in FIG. 1. In some such embodiments, each wire-skew adjustment circuit may include a plurality of capacitive elements, and each wire-specific skew control signal may be composed of a plurality of bits, each bit selectively coupling a corresponding capacitive element of the plurality of capacitive elements to the corresponding wire to adjust the wire-specific skew of the corresponding wire.

As previously described, the wire-specific transition delta, MIC input coefficient components and early-late indication components are used to produce sub-channel specific skew measurement signals that are combined to generate wire-specific skew control signals corresponding to possible timing behaviors for the wire signals. Combining multiple sub-channel specific skew measurements signals leads to accurate predictions of the timing skew of each wire.

Wire-specific skew control circuit 200 illustrates the processing to update the votes for one particular wire W1, in accordance with some embodiments. The early-late indication components 170/172/174 obtained from each sub-channel output are multiplied by the MIC input coefficient corresponding to that wire's contribution to that sub-channel output, and by the computed wire-specific transition delta for that wire. Thus, multiplier 250 accepts the sub-channel 1 early-late indication component 170, the MIC input coefficient component MIC1 corresponding to Wire 1 being received at MIC 702 associated with sub-channel 1 (which may be seen from Eqn. 1 and FIG. 7 to be "+1"), and the W1 wire-specific transition delta W1Δ from the set of wire-specific transition deltas 225. It should be noted that multiplier 250 need not embody a full multivariable multiplication function; early-late indication component 170 may be a binary or a numerical representation of two possible values (1 bit), the wire amplitude may be one of four possible values (2 bits), and the MIC input coefficient component is a constant of either "+1" or "−1" (1 bit). Thus, in a fully digital embodiment a Boolean computation of at most 1+2+1=4 bits of input and producing a sub-channel specific skew measurement signal composed of several bits of result might suffice, while in an analog embodiment the "combination" might be performed e.g., by a differential amplifier with multiple fixed input weights. As noted above, in some embodiments, each MIC input coefficient component may be represented as two or more bits, e.g., in the Glasswing code each MIC input coefficient component may be represented as 3 bits encompassing the 5 possible input coefficient components (±1, +½, ±⅓). One may notice that four of the five sub-channels in the Glasswing matrix defined in Eqn. 2 have multiple zero elements. Sub-channels with zero elements indicate that the sub-channel is carried by only a subset of the wires of the multi-wire bus, and have no effect on the remaining wires. In some embodiments that utilize symmetrical circuit layouts, multipliers (e.g., 250, 251, 252) may be configurable to apply a MIC input weighting coefficient of '0' for sub-channel MICs for which a given wire is not connected to. For example, referring to Eqn. 2, the third row of the matrix corresponding to sub-channel MIC 2:

[½, −1, ½, 0 0 0]

is carried by three out of the six total wires of the multi-wire bus. Thus, the multipliers for MIC2 may have MIC input weighting coefficients of '½' in the wire-specific skew control circuit for wire w1, '−1' in the wire-specific skew control circuit for wire w2, '½' in the wire-specific skew control circuit for wire w3, and '0' in the wire-specific skew control circuits for wires w4, w5, and w6.

In alternative embodiments, a given wire may include multipliers for only the sub-channels for which the given wire is associated. For example, wire w1 in the Glasswing code may be include multipliers for generating sub-channel specific skew measurement signals for first [1, 0, −1, 0, 0, 0], second [½, −1, ½, 0, 0, 0], and fifth sub-channels [⅓, ⅓, ⅓, −⅓, −⅓, −⅓] as the first element of each of the first, second and fifth sub-channels is non-zero.

Similarly, 251 performs the equivalent computation for sub-channel 2, using the early-late indication component 172 and the MIC2 input coefficient component corresponding to Wire 1 received at MIC 704 associated with sub-channel 2, and 253 performs the equivalent computation for sub-channel 3, using the early-late indication component 174 and the MIC3 input coefficient component corresponding to Wire 1 being received at the MIC 706 associated with sub-channel 3.

The conditional summation of those sub-channels for which a qualified early-late indication component exists is illustrated by transition gates 240, 241, 242, which allow the sub-channel specific skew measurement signals to enter combiner 260 along with the existing or "old" wire 1 vote total. This illustrative convenience would be appropriate for an analog combiner embodiment, with an equivalent digital combiner using the qualification signals as enables for the summation components. The summation of the old vote and the wire-specific skew control signal produces the New Wire 1 vote total.

Wire-specific skew control circuits 201, 202, and 203 perform the equivalent computations for Wires W2, W3, and W4 using the illustrated input signals, respectively, and the appropriate MIC input coefficients for the combination of sub-channel and wire being processed.

Figure 6:
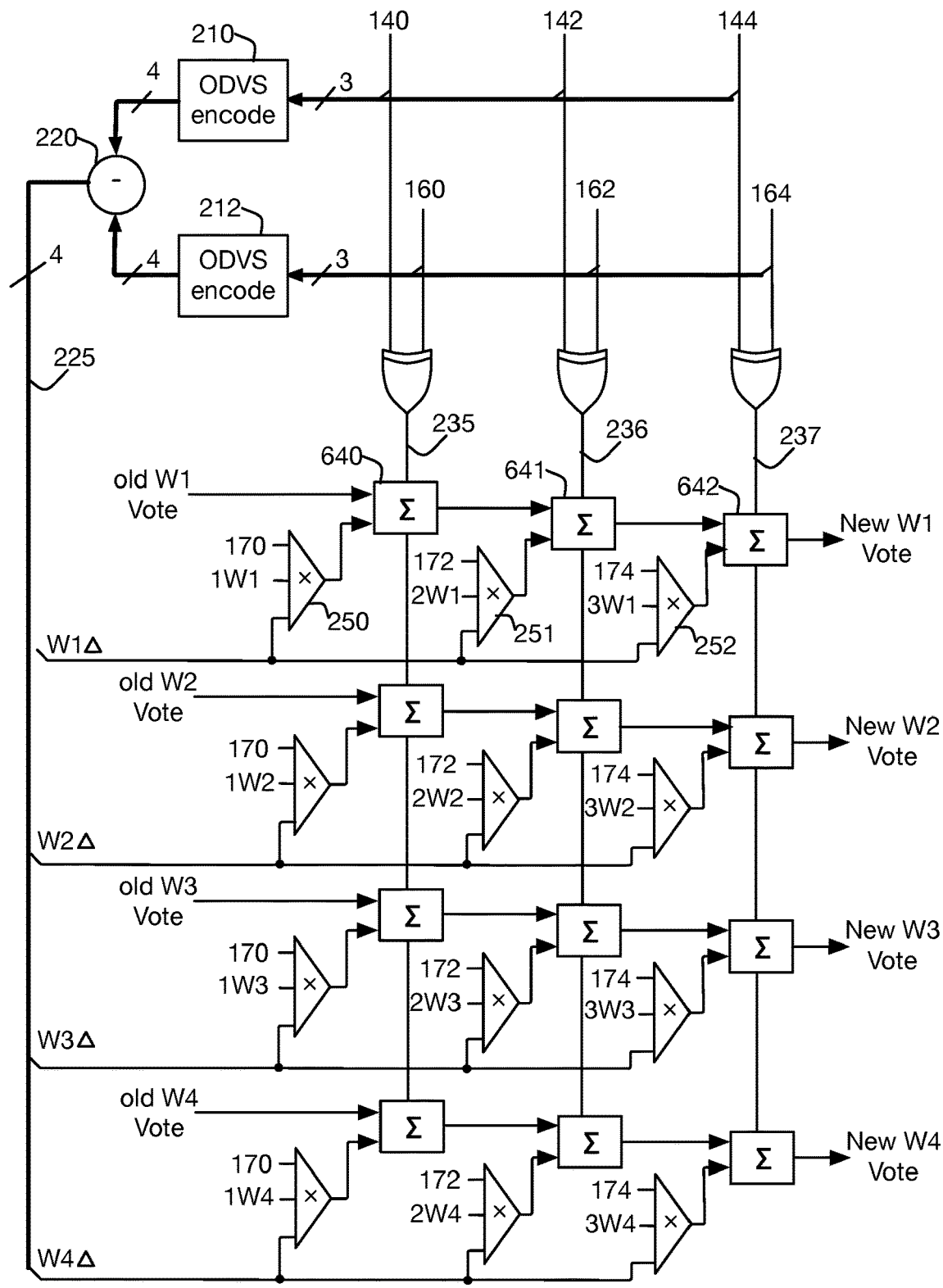
FIG. 6 is a block diagram of a skew control circuit, in accordance with some embodiments.

FIG. 6 is a detailed block diagram of a skew control circuit in which the old wire votes are incrementally updated via the wire-specific control signal using cascaded summation circuits 640/641/642 to generate the new wire vote. In such embodiments, each sub-channel specific skew measurement signal is applied in response to outputs of the logical XORs 325/326/327 indicating that the corresponding sub-channel has undergone a transition.

Figure 4:
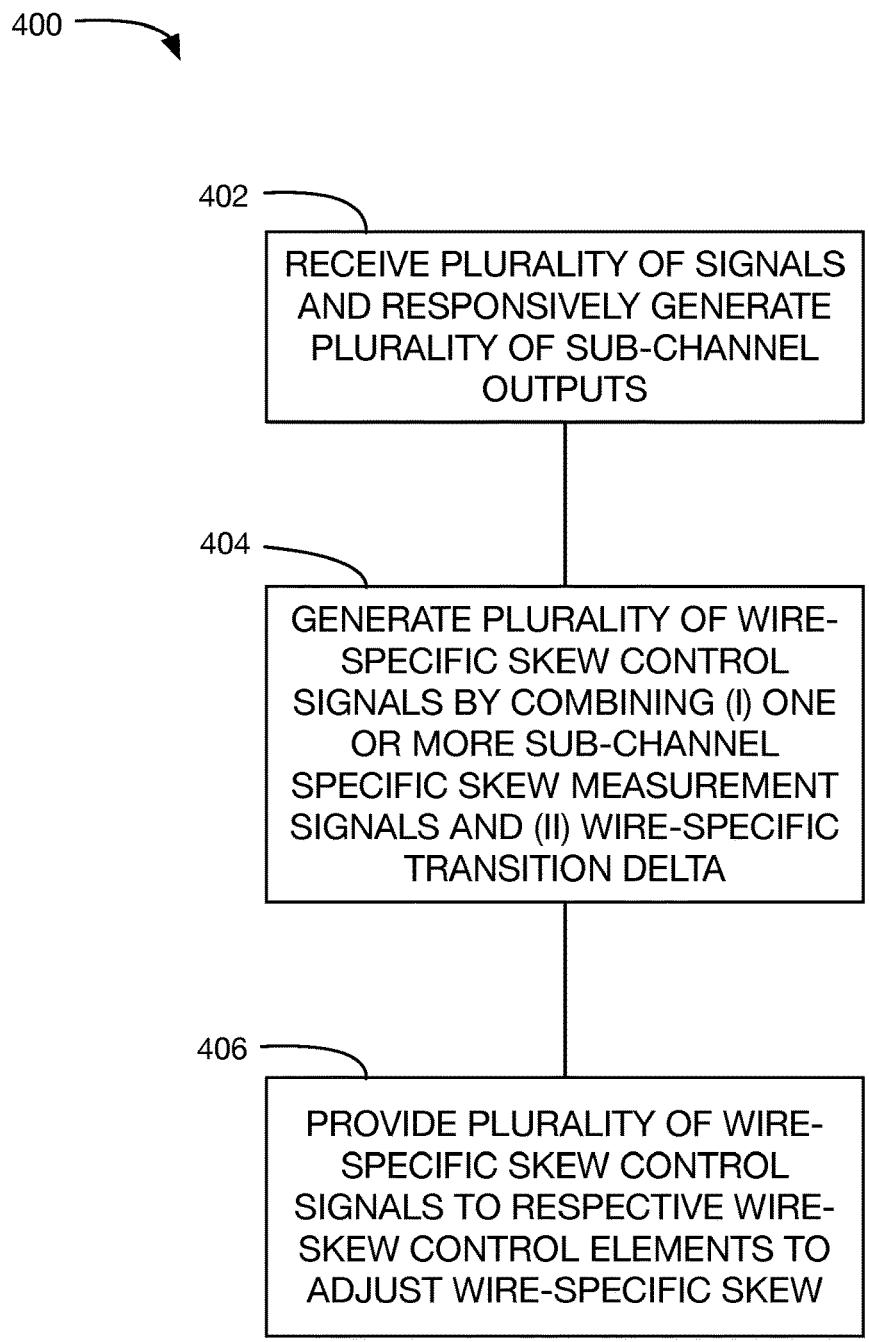
FIG. 4 is a block diagram illustrating a process in accordance with some embodiments.

A pseudocode description of an embodiment of this skew detection algorithm is provided as Appendix I, and FIG. 4 is a flow chart of a method 400, in accordance with some embodiments. As shown in FIG. 4, the method 400 includes receiving 402 a plurality of signals corresponding to symbols of a codeword on a plurality of wires of a multi-wire bus, and responsively generating a plurality of sub-channel outputs using a plurality of multi-input comparators (MICs) connected to the plurality of wires of the multi-wire bus. A plurality of wire-specific skew control signals are generated 404, each wire-specific skew control signal of the plurality of wire-specific skew control signals generated by combining (i) one or more sub-channel specific skew measurement signals associated with corresponding sub-channel outputs undergoing a transition and (ii) a corresponding wire-specific transition delta. the plurality of wire-specific skew control signals are provided 406 to respective wire-skew control elements to adjust wire-specific skew.

In some embodiments, the corresponding wire-specific transition delta includes a transition magnitude and transition direction.

In some embodiments, the method includes generating the corresponding wire-specific transition delta by generating a plurality of signals corresponding to recreated symbols of the received codeword and recreated symbols of a previously-received codeword and forming a difference 220 between a signal corresponding to a recreated symbol of the received codeword and a signal corresponding to a recreated symbol of the previously-received codeword. In some such embodiments, generating the plurality of signals corresponding to recreated symbols of the received codeword and the previously-received codeword includes re-encoding corresponding sets of sub-channel outputs, using e.g., local encoders 210 and 212.

In some embodiments, each sub-channel specific skew measurement signal includes a corresponding early-late indication component 170/172/174 obtained based on the corresponding sub-channel output 140/142/144. In some embodiments, each sub-channel specific skew measurement signal includes a corresponding MIC input weighting coefficient component.

In some embodiments, each wire-specific skew control signal of the plurality of wire-specific skew control signals is provided to a corresponding wire-skew adjustment circuit connected to a corresponding wire of the plurality of wires of the multi-wire bus. In some embodiments, each wire-skew adjustment circuit includes a plurality of capacitive elements, and wherein each wire-specific skew control signal comprises a plurality of bits, each bit selectively coupling a corresponding capacitive element of the plurality of capacitive elements to the corresponding wire to adjust the wire-specific skew of the corresponding wire.

In some embodiments, the method further includes identifying the sub-channel outputs undergoing a transition by comparing a plurality of previously-decoded sub-channel outputs to the generated plurality of sub-channel outputs. In some such embodiments, comparing the plurality of previously-detected sub-channel outputs to the generated plurality of sub-channel outputs comprises performing sub-channel specific XOR operations 230/231/232 between sub-channel outputs of the generated plurality of sub-channel outputs 140/142/144 and corresponding sub-channel outputs of the previously-detected sub-channel outputs 160/162/164, respectively.

Correcting Wire Skew

Numerous methods of introducing delay into a continuous time analog signal path are known in the art, including passive and active delay lines incorporating fixed and/or variable R, L, C elements; adjustment of supply current, bias current, or loading of an analog gain stage; modifying the capacitive and/or resistive loading of a circuit node within an analog stage, etc. Any such method may be applied to the individual wire signal chains of a multiwire receiver, to facilitate equalizing the effective arrival time of the signals and thus minimize perceived signal skew.

In cases where bidirectional communication is possible, a protocol may be used to communicate perceived signal timing differences as wire-specific skew control signals to the transmitter, which may then transmit individual wire signals with differing time offsets to minimize received signal arrival time differences.

Skew may also be eliminated by adjusting individual wire transmission times. Such an approach communicates information gathered by the receiver, e.g. relative receive times on the various wires, to the transmitter so that the transmitter may adjust its wire transmission times accordingly. In some embodiments, additional information is communicated permitting variations in communication wire mapping, including transpositions and order reversals, to be identified and corrected. This communication may be driven by the receiver, or may be distributed by a separate command/control processor, in either case communicating over a return data channel, out of band command/control channel, or other communication interface using known art protocols and methods outside the scope of this document.

For simplicity of description, these following skew detection descriptions merely assume that the effective arrival time of individual wire signals can be varied so as to reduce or eliminate the skew, e.g. by introducing a configurable delay into those wire signal paths (110, 112, 114, 116 of FIG. 1) without implying limitation as to delay means or location at receiver or transmitter. Other skew elimination methods known to the art are equally applicable in combination with the skew detection described herein.

As with conventional Clock-Data-Alignment circuits, significant positive or significant negative vote totals across all wires generally indicate that the sampling clock phase should be adjusted. In at least one embodiment, a conventional summation derived from all CDR sampler results is produced separately and used to control clock phase. With that source of systemic vote total eliminated over time, the summed votes for individual wires will tend to represent only wire skew, not overall clock phase error. In some embodiments, control of the clock phase may be so configured such that the wire signal with the latest arrival time needs zero additional delay, with various amounts of signal delay introduced into earlier-arriving wire signals paths to provide the described skew mitigation.

Some embodiments invoke such delay modifications as the wire votes are summed. Other embodiments perform delay modifications separately, as a periodic adjustment activity and/or as part of an initialization, calibration, or specifically invoked adjustment action.

Refactoring, regrouping, and performance optimizations of the voting procedure remain in accordance with the described embodiments. As a particular example, it may be noted that the identification of wire transitions is a strict function of the present and previous values of detected data D(t) and D(t–1), thus an advanced embodiment may pre-calculate the corresponding wire transitions for all combinations of present and previous sub-channel outputs to expedite voting computation. An embodiment may implement part or all of the described operations as software executed by a CPU, as steps of a Finite State Machine, or as clocked or unclocked digital logic. Some embodiments compute votes for multiple wires and/or for multiple sub-channels concurrently, i.e. essentially in parallel, rather than in the sequential order used in some examples for descriptive simplicity.

Similarly, some embodiments may differ in how they handle multiple sub-channels simultaneously reporting the acquisition of qualified CDA samples. A minimal embodiment may compute and add wire votes from only one such sub-channel in a given receive unit interval; variations include random selection of the chosen sub-channel, round-robin selection of the chosen sub-channel, first-found among the sub-channels in a particular order, etc. A more elaborate embodiment may compute and add wire votes from more than one sub-channel having a qualified CDA sample within the same receive unit interval. Other embodiments may use computed wire votes directly, rather than maintaining a running total over time. Votes may be represented as signed or unsigned integers, unary strings or arrays of bits, analog voltages, etc.

APPENDIX I

ODVS sub-channels: (s)
Wires: (w)
Data detected on sub-channel s at time t: data(s, t), at time t − 1 : data(s, t−1)
Sampled signal edge on sub-channel s at time t: CDR[s]
Aggregate data word D[ s−1, ... , 0] at time t: D(t), at time t − 1 : D(t−1)
ODVS encoding of D(t) on wire w:   w = code[ w, D(t)]
temp c;

APPENDIX I-continued

For each subroutine s,
    if ( data(s, t) XOR data(s, t−1)) // if there is a transition on this
    sub-channel
        for each wire w,
            c = ( 2 * CDR[s] − 1);   //convert 0,1 into +1 or −1
            // each vote is CDR polarity * mic weight * wire transition
            vote[w] += c * mic[s, w] * ( code[w, D(t) ] − code[w,
            D(t−1)] );
        end
    endif
end

I claim:

1. A method comprising:
obtaining a set of information bits;
generating a plurality of signals corresponding to symbols of a codeword by forming a weighted summation of a plurality of mutually orthogonal sub-channel vectors, each sub-channel vector (i) modulating a respective wire group of a multi-wire bus according to a respective bit of the set of information bits, and (ii) having weighting coefficients for each wire in the respective wire group;
receiving a plurality of wire-specific skew control signals, each wire-specific skew control signal associated with a respective wire of the multi-wire bus, each wire-specific skew control signal based at least in part on sub-channel specific skew measurement signals made on corresponding sub-channel outputs associated with sub-channel vectors of the plurality of the mutually orthogonal sub-channel vectors that contain the respective wire within the respective wire group; and
transmitting each signal of the plurality of signals over a respective wire of the multi-wire bus, each signal transmitted with a differing time offset to reduce received signal arrive time differences.

2. The method of claim 1, wherein each sub-channel specific skew measurement signal comprises a corresponding wire-specific transition delta.

3. The method of claim 2, wherein the corresponding wire-specific transition delta comprises a transition magnitude and transition direction of the respective wire within the wire group.

4. The method of claim 2, further comprising generating the corresponding wire-specific transition delta by analyzing codewords transmitted in consecutive signaling intervals.

5. The method of claim 1, wherein each sub-channel specific skew measurement signal is further based on a corresponding weighting coefficient in the associated sub-channel vector.

6. The method of claim 1, wherein each sub-channel specific skew measurement signal comprises a corresponding early-late indication component obtained based on the corresponding sub-channel output.

7. The method of claim 6, wherein the early-late indication components are obtained from sub-channel outputs undergoing a transition.

8. The method of claim 1, wherein the plurality of wire-specific skew control signals are received from a skew control circuit.

9. The method of claim 8, wherein the skew control circuit is in a receiver connected at an opposing end of the multi-wire bus.

10. The method of claim 1, wherein at least one sub-channel vector comprises weighting coefficients of at least two different magnitudes.

11. An apparatus comprising:
an encoder configured to obtain a set of information bits, and to generate a plurality of signals corresponding to symbols of a codeword by forming a weighted summation of a plurality of mutually orthogonal sub-channel vectors, each sub-channel vector (i) modulating a respective wire group of a multi-wire bus according to a respective bit of the set of information bits, and (ii) having weighting coefficients for each wire in the respective wire group; and
a line driver configured to:
receive a plurality of wire-specific skew control signals, each wire-specific skew control signal associated with a respective wire of the multi-wire bus, each wire-specific skew control signal based at least in part on sub-channel specific skew measurement signals made on corresponding sub-channel outputs associated with sub-channel vectors of the plurality of the mutually orthogonal sub-channel vectors that contain the respective wire within the respective wire group; and
transmit each signal of the plurality of signals over a respective wire of the multi-wire bus, the line driver configured to induce a differing time offset into each transmitted signal to reduce received signal arrive time differences.

12. The apparatus of claim 11, wherein each sub-channel specific skew measurement signal comprises a corresponding wire-specific transition delta.

13. The apparatus of claim 12, wherein the corresponding wire-specific transition delta comprises a transition magnitude and transition direction of the respective wire within the wire group.

14. The apparatus of claim 12, further comprising generating the corresponding wire-specific transition delta by analyzing codewords transmitted in consecutive signaling intervals.

15. The apparatus of claim 11, wherein each sub-channel specific skew measurement signal is further based on a corresponding weighting coefficient in the associated sub-channel vector.

16. The apparatus of claim 11, wherein each sub-channel specific skew measurement signal comprises a corresponding early-late indication component obtained based on the corresponding sub-channel output.

17. The apparatus of claim 16, wherein the early-late indication components are obtained from sub-channel outputs undergoing a transition.

18. The apparatus of claim 11, further comprising a skew control circuit configured to generate the plurality of wire-specific skew control signals.

19. The apparatus of claim 18, wherein the skew control circuit is in a receiver connected at an opposing end of the multi-wire bus.

20. The apparatus of claim 11, wherein at least one sub-channel vector comprises weighting coefficients of at least two different magnitudes.

* * * * *